(12) United States Patent
Seong et al.

(10) Patent No.: US 10,985,347 B2
(45) Date of Patent: Apr. 20, 2021

(54) DISPLAY APPARATUS

(71) Applicant: LG Display Co., Ltd., Seoul (KR)

(72) Inventors: Miryn Seong, Incheon (KR); Hyokang Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/213,515

(22) Filed: Dec. 7, 2018

(65) Prior Publication Data

US 2019/0181385 A1 Jun. 13, 2019

(30) Foreign Application Priority Data

Dec. 13, 2017 (KR) .................. 10-2017-0170948

(51) Int. Cl.
*H01L 51/52* (2006.01)
*H01L 51/56* (2006.01)
*H01L 27/32* (2006.01)

(52) U.S. Cl.
CPC ........ *H01L 51/5284* (2013.01); *H01L 27/322* (2013.01); *H01L 51/5253* (2013.01); *H01L 51/56* (2013.01); *H01L 27/3246* (2013.01)

(58) Field of Classification Search
CPC .............. H01L 27/322; H01L 27/3272; H01L 27/3211; H01L 51/5284; H01L 51/5253; H01L 51/56; G02F 1/133512; G02F 1/133514
USPC ........................................................ 257/40
See application file for complete search history.

(56) References Cited

U.S. PATENT DOCUMENTS

| | | | |
|---|---|---|---|
| 2003/0147115 A1* | 8/2003 | Takizawa ......... | G02F 1/133512 359/263 |
| 2013/0299791 A1* | 11/2013 | Hirakata ............ | H01L 27/3246 257/40 |
| 2015/0338702 A1* | 11/2015 | Xie .................. | G02F 1/133512 349/106 |
| 2015/0340412 A1* | 11/2015 | Lee ...................... | H01L 27/322 257/88 |
| 2018/0088261 A1* | 3/2018 | Song ..................... | G02B 5/206 |

* cited by examiner

*Primary Examiner* — Mohammed Shamsuzzaman
*Assistant Examiner* — Aaron J Gray
(74) *Attorney, Agent, or Firm* — Fenwick & West LLP

(57) ABSTRACT

A display apparatus includes a buffer layer provided on a substrate and having a plurality of concave portions and a black matrix disposed at each of the plurality of concave portions, whereby loss of the black matrix may be prevented and a filling material may be uniformly filled when a transistor substrate and a color filter substrate are bonded.

6 Claims, 6 Drawing Sheets

DISPLAY APPARATUS

CROSS-REFERENCE TO RELATED APPLICATIONS

This application claims to Republic of Korea Patent Application No. 10-2017-0170948 filed on Dec. 13, 2017, which is hereby incorporated by reference in its entirety.

BACKGROUND

Field of the Technology

The present disclosure relates to a display apparatus.

Discussion of the Related Technology

Display apparatuses are widely used as display screens of notebook computers, tablet computers, smartphones, portable display apparatuses, portable information devices, and the like, as well as display screens of televisions or monitors.

Liquid crystal displays and organic light emitting displays display images using transistors (i.e., thin film transistors) as switching elements. Since a liquid crystal display is not a self-luminous type of display, it displays an image using light emitted from a backlight unit disposed under a liquid crystal display panel. The liquid crystal display has a backlight unit, and thus, there are restrictions in design and luminance and a response speed may be lowered. The organic light emitting display includes an organic material, and thus, it may be vulnerable to moisture and reliability and a service life thereof may be deteriorated.

In recent years, research and development on organic light emitting displays using micro-light emitting elements have been done and made. Such organic light emitting displays have come to prominence as next generation displays due to high image quality and high reliability.

In a related display apparatus, a polyimide substrate and a buffer layer are sequentially stacked on a carrier glass substrate and a black matrix is patterned on the buffer layer. However, the buffer layer and the black matrix are not stably adhered to each other due to a difference in surface energy between the two, and thus, the black matrix pattern is lost. In order to solve the problem, in the related display apparatus, loss of the black matrix pattern may be prevented by patterning the black matrix directly on the polyimide substrate, but, in this case, a filling material is not uniformly filled at the time of bonding a transistor substrate and a color filter substrate, causing smears to be formed on the display panel.

SUMMARY

Accordingly, the present disclosure is directed to providing a display apparatus that substantially obviates one or more problems due to limitations and disadvantages of the related art.

An aspect of the present disclosure is directed to providing a display apparatus in which loss of a black matrix pattern may be prevented and a filling material may be uniformly provided at the time of bonding a transistor substrate and a color filter substrate, by including a buffer layer having a concave portion.

Another aspect of the present disclosure is directed to providing a display apparatus in which a buffer layer having a plurality of concave portions is provided and a bottom surface of the plurality of concave portions is implemented as an irregular surface, thus preventing loss of a black matrix pattern to prevent light leakage and a degradation of visibility, and a filling material is uniformly filled between a transistor substrate and a color filter substrate to prevent a smearing phenomenon in a display panel.

Another aspect of the present disclosure is directed to providing a display apparatus in which a thickness of a buffer layer is increased by alleviating stress applied to the buffer layer and reliability of the display apparatus is enhanced by enhancing a waterproof function of a display panel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a buffer layer provided on a substrate and having a plurality of concave portions and a black matrix disposed at each of the plurality of concave portions.

In another aspect of the present disclosure, there is provided a display apparatus including a buffer layer provided on a substrate, a black matrix provided on the buffer layer and having a lower end disposed to be lower than a height of an upper end of the buffer layer with respect to the substrate, and a color filter having a lower end disposed to have a step with the lower end of the black matrix.

Details of other embodiments are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a portion of this application, illustrate embodiments of the disclosure and together with the description serve to explain the principle of the disclosure. In the drawings.

DETAILED DESCRIPTION OF THE DISCLOSURE

Figure 1:
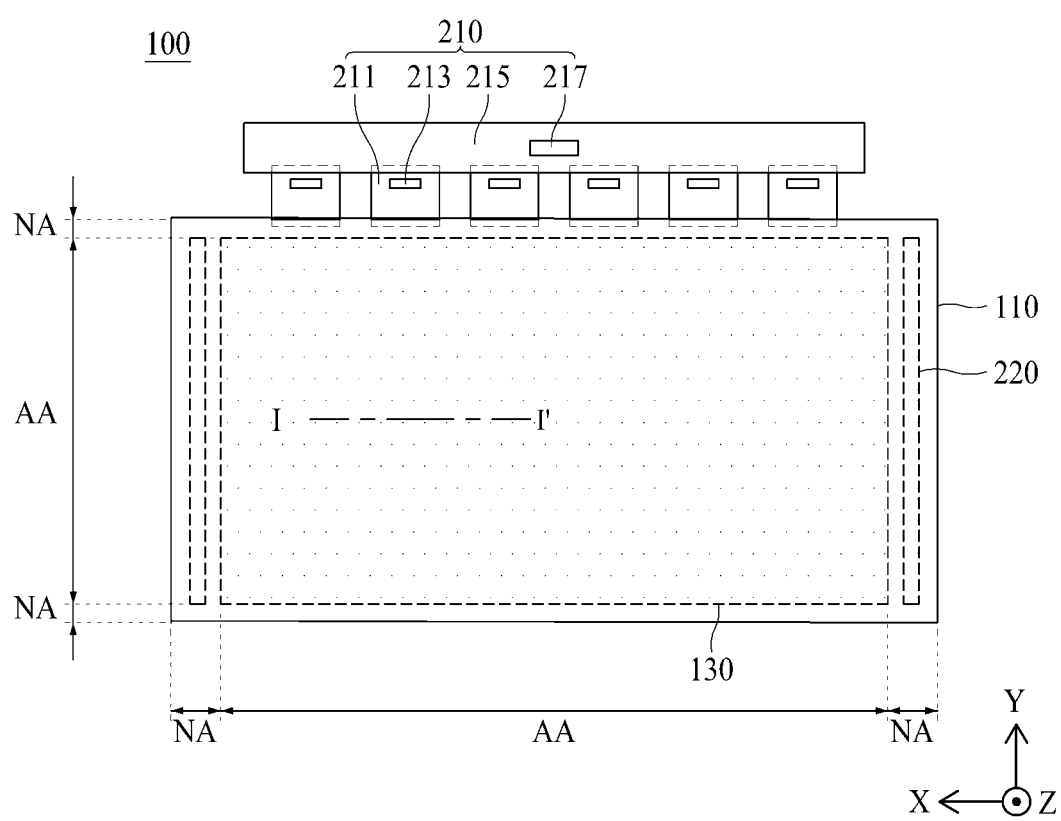
FIG. 1 is a plan view illustrating a display apparatus according to an example of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a positional relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Therefore, in the present disclosure, examples of the display apparatus may include a display apparatus itself, such as a liquid crystal module (LCM) or an organic light emitting display (OLED) module, and a set device which is a final consumer device or an application product including the LCM or the OLED module.

Moreover, if the display panel is an organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin-film transistor, or TFT, which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, such as a quantum dot layer, or the like).

Moreover, the display panel may further include a backing such as a metal plate attached to the display panel. However, the present embodiment is not limited to the metal plate, and the display panel may include another structure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, embodiments of the present disclosure will be described in detail with reference to the accompanying drawings.

Figure 2:
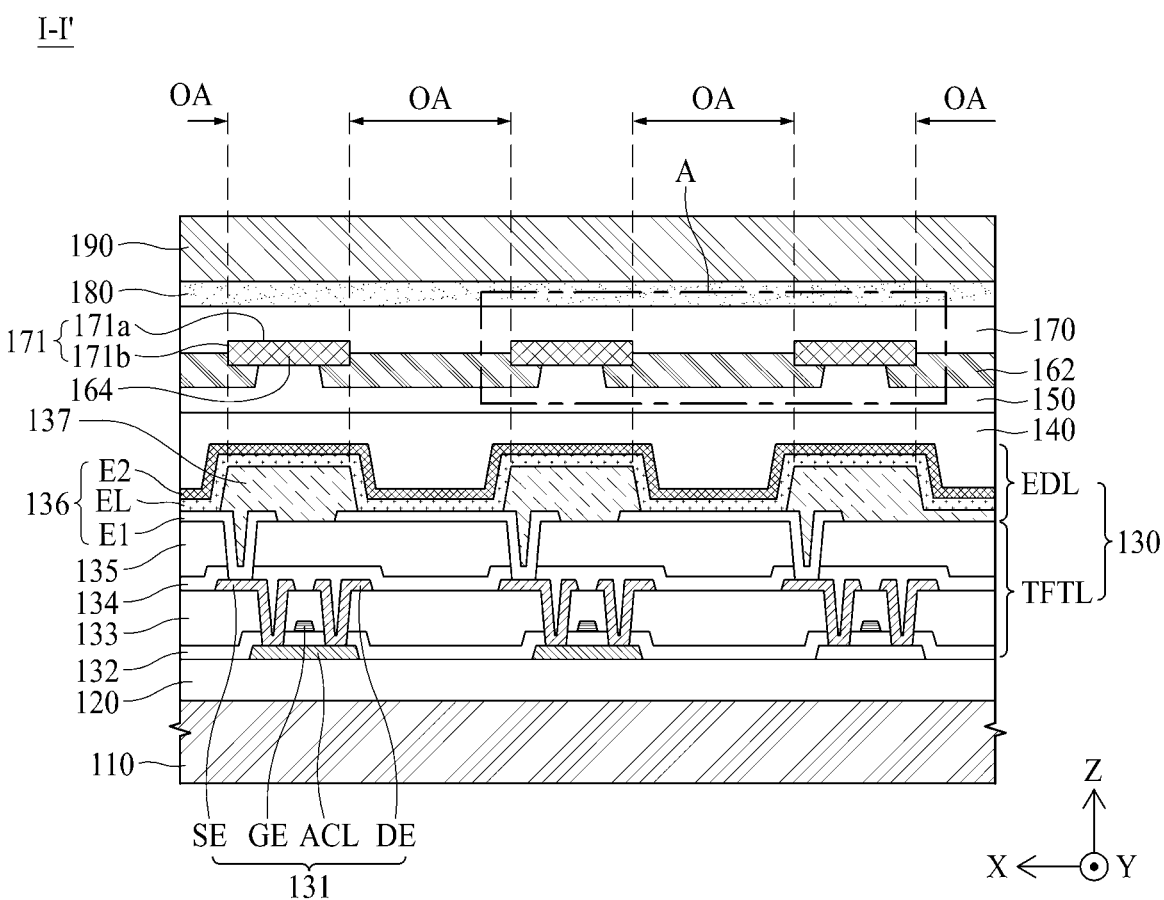
FIG. 2 is a cross-sectional view taken along line I-I' of FIG. 1, according to an embodiment of the present disclosure.

FIG. 1 is a plan view illustrating a display apparatus according to an example of the present disclosure, and FIG. 2 is a cross-sectional view taken along line I-I' of FIG. 1.

Referring to FIGS. 1 and 2, a display apparatus 100 includes a transistor substrate 110, a first buffer layer 120, a pixel array layer 130, an encapsulation layer 140, a filling layer 150, a black matrix 164, a second buffer layer 170, a substrate 180, a window cover 190, a display driving circuit unit 210, and a scan driving circuit unit 220.

The transistor substrate 110, a base substrate, may be a flexible substrate. For example, the transistor substrate 110 may include a transparent polyimide material. Considering that a high temperature deposition process is performed on the transistor substrate 110 formed of polyimide, polyimide excellent in heat resistance that may withstand high temperatures may be used. The transistor substrate 110 formed of polyimide may be formed by curing a polyimide resin coated on a front surface of a sacrificial layer provided on a carrier glass substrate to a predetermined thickness. Here, the carrier glass substrate may be separated from the transistor substrate 110 by the release of the sacrificial layer according to a laser-releasing process. The sacrificial layer may be formed of amorphous silicon (a-Si) or silicon nitride (SiNx).

According to an example, the transistor substrate 110 may be a glass substrate. For example, the transistor substrate 110 may include silicon oxide (SiO$_2$) or aluminum oxide (Al$_2$O$_3$) as a main component.

The transistor substrate 110 may include a display area AA and a non-display area NA. The display area AA may be defined at a central portion of the transistor substrate 110, as an area in which an image is displayed. Here, the display area AA may correspond to an active area of a pixel array layer 130. For example, the display area AA may include a plurality of pixels (not shown) formed at each pixel region in which a plurality of gate lines (not shown) and a plurality of data lines (not shown) intersect each other. Here, each of the plurality of pixels may be defined as a minimum unit area for emitting light.

The non-display area NA may be defined at an edge portion of the transistor substrate 110 surrounding the display area AA as an area where no image is displayed.

The first buffer layer 120 may be provided on the transistor substrate 110. The first buffer layer 120 may be formed on the entire surface of the transistor substrate 110 to block moisture penetrating through the pixel array layer 130 through the transistor substrate 110. The first buffer layer 120 may be formed by stacking a plurality of inorganic layers. For example, the first buffer layer 120 may be formed as a multi-layer including at least one of a silicon oxide layer (SiOx), a silicon nitride layer (SiNx), and a silicon oxynitride layer (SiON). Since the buffer layer 120 includes a plurality of inorganic layers, a water vapor transmission rate (WVTR) of the panel may be improved.

The pixel array layer 130 includes a thin film transistor (TFT) layer TFTL and a light emitting element layer EDL. The TFT layer TFTL may include a TFT 131, a gate insulating layer 132, an interlayer insulating layer 133, a passivation layer 134, and a planarization layer 135.

The TFT 131 may be provided in the display area AA on the transistor substrate 110. The TFT 131 may include an active layer ACL, a gate electrode GE, a drain electrode DE, and a source electrode SE.

The active layer ACL may be provided in the display area AA of the transistor substrate 110. The active layer ACL may be arranged to overlap the gate electrode GE, the drain electrode DE, and the source electrode SE. The active layer ACL may directly contact the drain electrode DE and the source electrode SE and face the gate electrode GE with the gate insulating layer 132 interposed between the gate electrode GE and the active layer ACL. According to an example, a portion of the active layer (ACL) may be formed of a semiconductor material not doped with a dopant, and another portion of the active layer (ACL) may be formed of a semiconductor material doped with a dopant.

The gate electrode GE may be provided on the gate insulating layer 132. The gate electrode GE may overlap a central region of the active layer ACL with the gate insulating layer 132 interposed between them. For example, the gate electrode GE may be a single layer or a multiple layers formed of any one of molybdenum (Mo), aluminum (Al), chromium (Cr), gold (Au), titanium (Ti), nickel (Ni), neodymium (Nd), and copper (Cu) or an alloy thereof, but is not limited thereto.

The drain electrode DE and the source electrode SE may be provided on the interlayer insulating layer 133 and spaced apart from each other. The drain electrode DE may be in contact with one end of the active layer ACL through a first contact hole provided in the gate insulating layer 132 and the interlayer insulating layer 133, and the source electrode SE may be in contact with the other end of the active layer ACL through a second contact hole provided in the gate insulating layer 132 and the interlayer insulating layer 133. The source electrode SE may directly contact a first electrode E1 of an organic light emitting element 136 through a third contact hole of the planarization layer 135.

The gate insulating layer 132 may be provided on the active layer ACL. Specifically, the gate insulating layer 132 may be disposed on the active layer ACL and the transistor substrate 110, and may isolate the active layer ACL from the gate electrode GE. The gate insulating layer 132 may be formed on the entire surface of the display area AA of the transistor substrate 110 and removed in corresponding regions so as to be in contact with the active layer ACL, the drain electrode DE, and the source electrode SE. For example, the gate insulating layer 132 may include a first contact hole through which the drain electrode DE penetrates and a second contact hole through which the source electrode SE penetrates. The gate insulating layer 132 may be formed of an inorganic insulating material, e.g., silicon dioxide (SiO$_2$), silicon nitride (SiNx), and silicon oxynitride (SiON), or multiple layers thereof.

The interlayer insulating layer 133 may be provided on the gate electrode GE. For example, the interlayer insulating layer 133 may be an inorganic insulating material formed of silicon dioxide (SiO$_2$), a silicon nitride layer (SiNx), a silicon oxynitride layer (SiON), or multiple layers thereof, but is not limited thereto. The interlayer insulating layer 133 may be removed in corresponding regions so as to be in contact with the drain electrode DE or the source electrode SE. For example, the interlayer insulating layer 133 may include a first contact hole through which the drain electrode DE penetrates and a second contact hole through which the source electrode SE penetrates. Here, the first contact hole and the second contact hole of the interlayer insulating layer 133 may be connected to the first contact hole or the second contact hole of the gate insulating layer 132, respectively.

The passivation layer 134 may be provided on the TFT 131. Specifically, the passivation layer 134 may be formed to cover the source electrode SE, the drain electrode DE, and the data line to protect the TFT 131. For example, the passivation layer 134 may be an inorganic insulating material formed of silicon dioxide (SiO$_2$), a silicon nitride layer (SiNx), and a silicon oxynitride layer (SiON), or multiple layers thereof.

The planarization layer 135 may be provided on the passivation layer 134 to planarize the upper end of the TFT 131. The planarization layer 135 may be removed in a corresponding region for the first electrode E1 and the source electrode SE to contact each other. For example, the planarization layer 135 may include a third contact hole through which the first electrode E1 penetrates. According to an example, the planarization layer 135 may be formed of an organic insulating material such as an acrylic resin, an epoxy resin, a phenolic resin, a polyamide resin, a polyimide resin, or the like, but is not limited thereto.

The light emitting element layer (EDL) may include a plurality of organic light emitting elements 136 and a plurality of banks 137.

A plurality of organic light emitting elements 136 may be provided on the planarization layer 135 and electrically connected to the plurality of TFTs 131, respectively. The organic light emitting element 136 may include a first electrode E1, an organic light emitting layer EL, and a second electrode E2.

The first electrode E1 may be provided on the planarization layer 135. Specifically, the first electrode E1 may be disposed to overlap with an opening area OA of the organic light emitting element 136 defined by the bank 137. The first electrode E1 may be in contact with the source electrode SE of the TFT 131 through the third contact hole provided in the planarization layer 135. According to an example, the first electrode E1 may be formed of a transparent conductive material such as ITO, IZO, ZnO, or $In_2O_3$ having a large work function value, thereby serving as an anode.

The organic light emitting layer EL may be provided on the first electrode E1. According to an example, the organic light emitting layer EL may be realized in the form of an organic layer that is common to all the pixels without being divided by pixel regions. For example, the organic light emitting layer EL may be formed on the bank 137 as well as on the first electrode E1. Here, the organic light emitting layer EL may include a hole transporting layer, an organic light emitting layer, and an electron transporting layer. The organic light emitting layer (EL) may further include at least one functional layer for improving a luminous efficiency and a lifetime of the light emitting layer.

The second electrode E2 may be provided on the organic light emitting layer EL. For example, the second electrode E2 may be formed as an electrode that is common to all the pixels without being divided by pixel regions. When a voltage is applied to the first electrode E1 and the second electrode E2, holes and electrons may move to the light emitting layer through the hole transporting layer or the electron transporting layer, respectively, and may be combined with each other in the light emitting layer to emit light. The second electrode E2 may serve as a cathode of the organic light emitting element 136 and may be formed of an opaque metal material such as Li, Ca, LiF/Ca, LiF/Al, Al, Mg, or a compound thereof.

The plurality of banks 137 may be provided on the planarization layer 135. Specifically, each of the banks 137 is provided between adjacent first electrodes E1 to divide the first electrodes E1. Therefore, the plurality of banks 137 may electrically insulate the first electrodes E1 adjacent to each other to define the opening areas OA of the plurality of organic light emitting elements 136. For example, the plurality of banks 137 may be formed of an organic insulating material such as a polyimide resin, an acrylic resin, a benzocyclobutene (BCB), or the like, but is not limited thereto.

The encapsulation layer 140 may cover the pixel array layer 130. Specifically, the encapsulation layer 140 may be provided on the entire upper end of the second electrode E2. The encapsulation layer 140 may prevent penetration of moisture, or the like, that may be introduced from the outside, preventing deterioration of the organic light emitting layer EL. According to an example, the encapsulation layer 140 may be formed of a metal such as copper (Cu) and aluminum (Al), or the like, or an alloy thereof but is not limited thereto and may be realized with various materials known in the art.

The filling layer 150 fills a space between the transistor substrate 110 and the substrate 180 and is not spread to the outside of the display apparatus 100 by means of a dam (not shown). The filling layer 150 may be disposed between the transistor substrate 110 and the substrate 180 to prevent loss of light and increase adhesion between the transistor substrate 110 and the substrate 180.

The color filter 162 may be formed on the second buffer layer 170 and may be disposed between the plurality of concave portions 171. The transistor substrate 110 and the substrate 180 may be bonded so that the color filter 162 overlaps the organic light emitting element 136. The color filter 162 may be interposed between the filler layer 150 and the second buffer layer 170 and may be surrounded by the black matrix 164 patterned on the second buffer layer 170.

For example, each of the plurality of color filters 162 may be spaced apart from each other to correspond to each of the plurality of organic light emitting elements 136. As another example, each of the adjacent color filters 162 may correspond to each of the plurality of organic light emitting elements 136 and may contact each other. The color filter 162 may be disposed to correspond to the organic light emitting element 136 and convert the color of white light emitted from the organic light emitting element 136. For example, the plurality of color filters 162 may include a red color filter, a green color filter, and a blue color filter. Thus, a red subpixel, a green subpixel, and a blue subpixel of the plurality of subpixels may include the color filter 162, and a white subpixel may be implemented without the color filter.

The black matrix 164 may be patterned on the second buffer layer 170. Specifically, the black matrix 164 may be disposed on the concave portion 171 of the second buffer layer 170. The black matrix 164 may overlap the bank 137 defining the opening area OA of the organic light emitting element 136. For example, the black matrix 164 may be patterned on the second buffer layer 170 not to overlap the opening area OA of the organic light emitting element 136, and thereafter, when the transistor substrate 110 and the substrate 180 are bonded, the black matrix 164 may be disposed between the filling layer 150 and the second buffer layer 170. The black matrix 164 may be disposed between the adjacent color filters 162 to partition the color filters 162. Thus, the black matrix 164 may enclose the opening area OA of each of the plurality of organic light emitting elements 136 and may block light incident to the TFT 131. The black matrix 164 may prevent light emitted from the organic light emitting element 136 from leaking to the non-display area NA, preventing a reduction in a contrast ratio. Thus, since the black matrix 164 improves an aperture ratio and transmittance of the pixel array layer 130, power consumption may be reduced and brightness may be enhanced. The black matrix 164 may prevent light emitted from each of the plurality of organic light emitting elements 136 from being mixed with each other, improving light leakage and deterioration of visibility.

According to an example, a lower portion of the black matrix 164 may be surrounded by the concave portion 171, and an upper portion of the black matrix 164 may be surrounded by the plurality of color filters 162. Specifically, the lower portion of the black matrix 164 may be disposed in the concave portion 171 of the second buffer layer 170 and surrounded by the concave portion 171, and the upper portion of the black matrix 164 may protrude from the upper end surface of the second buffer layer 170 and may be surrounded by the plurality of color filters 162 disposed on the second buffer layer 170. Therefore, a height of the upper end of the black matrix 164 may be higher than a height of the upper end of the second buffer layer 170 with respect to the substrate 180. In this manner, since the black matrix 164 is disposed in the concave portion 171, surface energy between the black matrix 164 and the second buffer layer 170 may be optimized, and adhesion between the black matrix 164 and the second buffer layer 170 may be strengthened to prevent loss of the black matrix 164.

According to an example, the height of the upper end of the black matrix 164 may be equal to the height of the upper end of the second buffer layer 170 with respect to the substrate 180. Thus, since the black matrix 164 is entirely inserted into the concave portion 171, surface energy between the black matrix 164 and the second buffer layer 170 may be optimized, and adhesion between the black matrix 164 and the second buffer layer 170 may be strengthened to prevent loss of the black matrix 164. Also, when the upper portion of the black matrix 164 is entirely inserted into the concave portion 171, the entire side surface of the black matrix 164 may be in contact with an inner side surface 171b of the concave portion 171 and stably fixed, unlike the case where the upper portion of the black matrix 164 protrudes from an upper end 170b of the second buffer layer.

According to an example, the height of the upper end of the black matrix 164 may be lower than the height of the upper end of the second buffer layer 170 with respect to the substrate 180. Also, the lower end 162a of the color filter 162 may surround the upper end 170b of the second buffer layer 170 and the upper portion of the inner side surface 171b of the concave portion 171. Thus, since the black matrix 164 is entirely inserted into the concave portion 171 and the edge of the lower end 162a of the color filter 162 is inserted into the concave portion 171 to cover the upper end 164b of the black matrix 164, surface energy between the black matrix 164 and the second buffer layer 170 may be optimized, and adhesion between the black matrix 164 and the second buffer layer 170 may be enhanced to prevent loss of the black matrix 164. When the entirety of the black matrix 164 is inserted into the concave portion 171 and the edge of the lower end 162a of the color filter 162 is inserted into the concave portion 171, the entire side surface of the black matrix 164 may be in contact with the inner side surface 171b of the concave portion and stably fixed, and the upper end 164b of the black matrix 164 may be stably fixed by the edge of the lower end 162a of the color filter 162, unlike the case where the height of the upper end 164b of the black matrix 164 and the height of the upper end 170b of the second buffer layer 170 are equal.

The second buffer layer 170 may be provided on the substrate 180. The second buffer layer 170 may be formed on the entire surface of the substrate 180 to block moisture penetrating to the pixel array layer 130 through the substrate 180. The second buffer layer 170 may be formed by stacking a plurality of inorganic layers. For example, the second buffer layer 170 may be formed as a multi-layer in which one or more inorganic layers among a silicon oxide layer (SiOx), a silicon nitride layer (SiNx), and a silicon oxynitride layer (SiON) are stacked. Since the second buffer layer 170 includes a plurality of inorganic layers, the water vapor transmission rate (WVTR) of the panel may be improved.

The second buffer layer 170 may include a plurality of concave portions 171. Specifically, the plurality of concave portions 171 may have a step from the upper surface of the second buffer layer 170. The plurality of concave portions 171 may be formed by performing an etching process on the second buffer layer 170 and accommodate the black matrix 164. A bottom surface 171a of the concave portion 171 may be in contact with a lower end 164a of the black matrix 164 and the inner side surface 171b of the concave portion 171 may surround the side surface of the black matrix 164. As a result, the concave portion 171 may optimize surface energy between the black matrix 164 and the second buffer layer 170, and prevent loss of the black matrix 164.

According to an example, since the second buffer layer 170 includes the concave portion 171, stress applied to the second buffer layer 170 may be released. For example, as the thickness of the second buffer layer 170 increases, a moisture-proofing effect regarding the display panel is improved, but the second buffer layer 170 is vulnerable to stress. Therefore, the buffer layer according to the related art may not be increased in thickness by more than a predetermined level and may not simultaneously satisfy both the moisture-proofing effect and the stress dispersion effect. However, since the display apparatus 100 according to the present disclosure includes the concave portion 171 formed on the second buffer layer 170, stress may be prevented from concentrating on the second buffer layer 170, and reliability of the display apparatus 100 may be increased although the thickness of the display apparatus 170 is increased. As described above, the display apparatus 100 may satisfy both the moisture-proofing effect and the stress dispersion effect of the display panel.

The substrate 180 may face the transistor substrate 110 with the encapsulation layer 130 interposed between them. Specifically, the substrate 180 may be provided on the entire upper end of the filling layer 150. For example, the substrate 180 may be bonded to the transistor substrate 110 after the color filter 162 and the black matrix 164 are formed on the upper end of the substrate 180. Here, the substrate 180 may be disposed on the transistor substrate 110 to block the TFT 131 and the organic light emitting element 136 provided on the transistor substrate 110 from ambient moisture, air, and the like. According to an example, the substrate 180 is positioned to face the transistor substrate 110, and the transistor substrate 110 and the substrate 180 may be bonded to each other by a sealing member (not shown) disposed along the edge thereof. For example, the substrate 180 may be a glass substrate or a plastic substrate.

The window cover 190 may be bonded to the front surface of the substrate 180 by the medium of a cover adhesive member. According to an example, the window cover 190 may be formed of a plastic material, a metal material, or a glass material. The window cover 190 of the glass material may include a sapphire glass.

The display driving circuit unit 210 may be connected to a pad part provided in the non-display area NA of the transistor substrate 110 to display an image corresponding to image data supplied from the display driving system on each pixel. According to an example, the display driving circuit unit 210 may include a plurality of circuit films 211, a plurality of data driving integrated circuits (ICs) 213, a printed circuit board (PCB) 215, and a timing controller 217.

The input terminals provided on one side of each of the plurality of circuit films 211 may be attached to the PCB 215 by a film adhering process, and output terminals provided on the other side of each of the plurality of circuit films 211 may be adhered to the pad part through the film adhering process. According to an example, each of the plurality of circuit films 211 may be realized as a flexible circuit film to reduce a bezel area of the display apparatus 100 and may be bent to surround the side surface of the window cover 190.

Each of the plurality of data driving ICs 213 may be individually mounted on each of the plurality of circuit films 211. Each of the plurality of data driving ICs 213 may receive pixel data and a data control signal provided from the timing controller 217, convert the pixel data into an analog pixel data signal in accordance with the data control signal, and supply the same to a corresponding data line. According to an example, each of the plurality of data driving ICs 213 may be disposed on the side surface of the window cover 190 as the corresponding circuit film 211 is bent.

The PCB 215 may support the timing controller 217 and deliver signals and power between the components of the display driving circuit unit 210. According to an example, the PCB 215 may be disposed on the front surface of the window cover 190 according to bending of the circuit film 211.

The timing controller 217 may be mounted on the PCB 215 and receive image data and a timing synchronization signal provided from the display driving system through a user connector provided on the PCB 215. The timing controller 217 may generate pixel data by aligning the image data to fit to a pixel arrangement structure on the basis of the timing synchronization signal and provide the generated pixel data to the corresponding data driving integrated circuit 213. The timing controller 217 may generate a data control signal and a scan control signal on the basis of the timing synchronization signal, control a driving timing of each of the plurality of data driving ICs 213 through the data control signal, and control a driving timing of the scan driving circuit unit 220 through the scan control signal. Here, the scan control signal may be supplied to the corresponding scan driving circuit unit 220 through a first and/or last flexible circuit film among the plurality of circuit films 211 and the non-display area NA of the transistor substrate 110.

The scan driving circuit unit 220 may be provided in the non-display area NA of the transistor substrate 110. The scan driving circuit unit 220 may generate a scan signal according to the scan control signal provided from the display driving circuit unit 210 and supply the scan signal to the scan line corresponding to set order. According to an example, the scan driving circuit unit 220 may be formed in the non-display area NA of the transistor substrate 110 together with the TFT.

Figure 3:
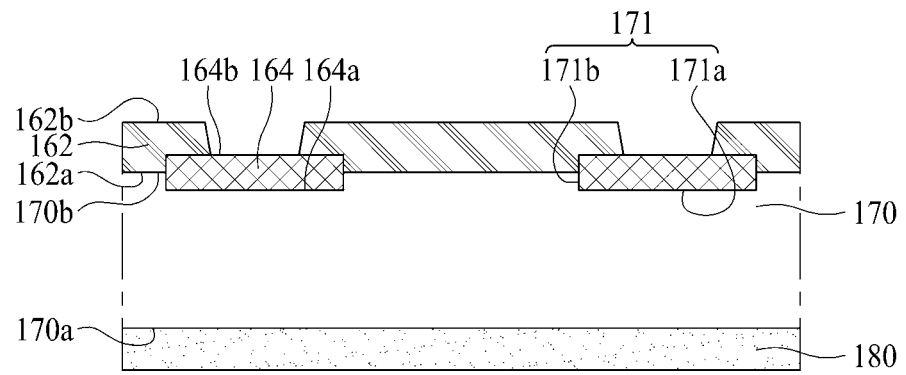
FIG. 3 is a cross-sectional view illustrating a region 'A' in FIG. 2, according to an embodiment of the present disclosure.

FIG. 3 is a cross-sectional view illustrating the area 'A' of FIG. 2.

Referring to FIG. 3, the second buffer layer 170 may be disposed on the substrate 180. For example, a lower end 170a of the second buffer layer may face the front surface of the substrate 180, and the upper end 170b of the second buffer layer may face the lower end 162a of the plurality of color filters or may include the concave portion 171.

The black matrix 164 may be patterned on the second buffer layer 170 and disposed in the concave portion 171 of the second buffer layer 170. According to an example, a portion of the black matrix 164 may be inserted into the concave portion 171. Specifically, a lower portion of the black matrix 164 may be surrounded by the concave portion 171, and an upper portion of the black matrix 164 may protrude from a surface of the upper end 170b of the buffer layer and surrounded by the plurality of color filters 162. For example, the lower end 164a of the black matrix 164 may be in contact with the bottom surface 171a of the concave portion, and the lower side surface of the black matrix 164 may be surrounded by the inner side surface 171b of the concave portion 171. The upper end 164b of the black matrix 164 may protrude from the upper end 170b of the second buffer layer 170 and may be surrounded by the plurality of color filters 162. Thus, a height of the upper end 164b of the black matrix 164 may be higher than a height of the upper end 170b of the second buffer layer 170 with respect to the substrate 180. A height of the upper end 162b of the plurality of color filters may be higher than the upper end 164b of the black matrix with respect to the substrate 180. Thus, the upper portion of the black matrix 164 may be disposed between the plurality of color filters 162. Each of the plurality of color filters 162 may be disposed between the plurality of concave portions 171 or between the black matrices 164 disposed in the plurality of concave portions 171.

Thus, since the black matrix is disposed in the concave portion 171, surface energy between the black matrix 164 and the second buffer layer 170 may be optimized and adhesion between the black matrix 164 and the second buffer layer may be enhanced to prevent loss of the black matrix 164. Here, since a portion of the black matrix 164 is inserted into the concave portion 171, the side surface of the black matrix 164 inserted into the concave portion 171 may be in contact with the inner side surface 171b of the concave portion 171 and stably fixed. As a result, surface energy between the lower end 164a of the black matrix 164 and the bottom surface 171a of the concave portion 171 may be optimized, and loss of the black matrix 164 in the display apparatus 100 may be prevented.

In this manner, since a portion of the black matrix 164 is inserted into the concave portion 171, the black matrix 164 may be maintained in a predetermined pattern form. Here, the predetermined pattern form of the black matrix 164 may be determined by a shape of the concave portion 171 viewed from the front of the display apparatus 100. For example, if the second buffer layer 170 does not include a plurality of concave portions 171, although the black matrix 164 is patterned on the second buffer layer 170, surface energy of the black matrix 164 and surface energy of the second buffer layer 170 may be different. Also, when the surface energy is different between the black matrix 164 and the second buffer layer 170, loss of the black matrix 164 may occur and a light leakage and visibility degradation phenomenon may occur in the portion where loss of the black matrix 164 occurs. Thus, in the display apparatus 100 according to the present disclosure, since the second buffer layer 170 having the plurality of concave portions 171 is provided and the black matrix 164 is patterned on each of the plurality of concave portions 171, loss of the matrix 164 pattern may be prevented.

In the display apparatus 100 according to the present disclosure, since the second buffer layer 170 having a plurality of concave portions 171 is disposed on a substrate 180 and a portion of the black matrix 164 is inserted into the concave portion 171, a filling material may be uniformly filled between the transistor substrate 110 and the substrate 180. For example, if the second buffer layer 170 is not disposed on the substrate 180 and the black matrix 164 is disposed directly on the substrate 180, then the filling material may be unevenly distributed when the transistor substrate 110 and the substrate 180 are bonded and a smear phenomenon may occur in a region where the filling material is insufficient. Thus, in the display apparatus 100 according to the present disclosure, the second buffer layer 170 disposed on the substrate 180 and having the plurality of concave portions 171 are provided and the black matrix 164 is patterned on each of the plurality of concave portions 171, whereby loss of the black matrix 164 may be prevented, and the filling material may be uniformly distributed when the transistor substrate 110 and the substrate 180 are bonded. In this manner, the display apparatus 100 may prevent the light leakage and the visible light deterioration phenomenon and also may prevent the smear phenomenon due to the uneven distribution of the filling material, as well as preventing the light leakage and visibility degradation phenomenon.

Figure 4:
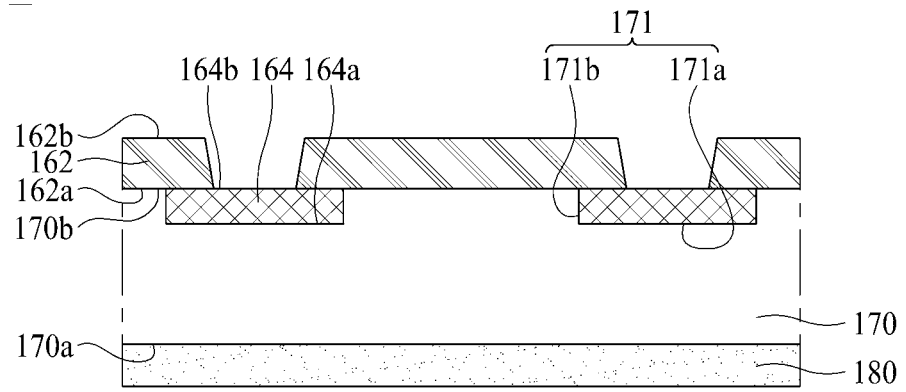
FIG. 4 is a cross-sectional view of the region 'A' of FIG. 2, illustrating another embodiment of a concave portion of a buffer layer and a black matrix.

FIG. 4 is a cross-sectional view illustrating the region 'A' of FIG. 2 and illustrating another embodiment of a concave portion of a buffer layer and a black matrix.

Referring to FIG. 4, the black matrix 164 may be patterned on the second buffer layer 170 and disposed in the concave portion 171 of the second buffer layer 170. According to an example, the black matrix 164 may be inserted into the concave portion 171. Specifically, the black matrix 164 may be surrounded by the concave portion 171, and the upper end 164b of the black matrix 164 may form the same layer as a surface of the upper end 170b of the second buffer layer. For example, a height of the upper end 164b of the black matrix 164 may be the same as a height of the upper end 170b of the second buffer layer with respect to the substrate 180. Also, a height of the upper end 164b of the black matrix 164 may be the same as a height of the lower end 162a of the color filter 162 with respect to the substrate 180. Thus, the lower end 164a of the black matrix 164 may be in contact with the bottom surface 171a of the concave portion 171, the side surface of the black matrix 164 may be surrounded by the inner surface 171b of the concave portion 171, and the upper end 164b of the black matrix 164 may form the same plane as the upper end 170b of the second buffer layer 170. That is, the lower end 162a of the color filter may form a flat surface. Each of the plurality of color filters 162 may be disposed between each of the plurality of concave portions 171 or each of the black matrices 164 disposed in the plurality of concave portions 171.

Thus, since the black matrix is entirely inserted into the concave portion 171, surface energy between the black matrix 164 and the second buffer layer 170 may be optimized, and adhesion between the black matrix 164 and the second buffer layer may be enhanced to prevent loss of the black matrix 164. Here, since the entirety of the black matrix 164 is inserted into the concave portion 171, the entire side surface of the black matrix 164 may be in contact with the inner side surface 171b of the concave portion 171 and stably fixed, unlike the case where an upper portion of the black matrix 164 protrudes from the upper end 170b of the second buffer layer. As a result, surface energy between the lower end 164a of the black matrix 164 and the bottom surface 171a of the concave portion 171 may be optimized and loss of the black matrix 164 in the display apparatus 100 may be prevented.

In this manner, since the entirety of the black matrix 164 is inserted into the concave portion 171, the black matrix 164 may be maintained in a predetermined pattern form. Here, the predetermined pattern form of the black matrix 164 may be determined by a shape of the concave portion 171 viewed from the front of the display apparatus 100. For example, if the second buffer layer 170 does not include a plurality of concave portions 171, although the black matrix 164 is patterned on the second buffer layer 170, surface energy of the black matrix 164 and surface energy of the second buffer layer 170 may be different. Also, when the surface energy is different between the black matrix 164 and the second buffer layer 170, loss of the black matrix 164 may occur, and a light leakage and visibility degradation phenomenon may occur in the portion where loss of the black matrix 164 occurs. Thus, in the display apparatus 100 according to the present disclosure, since the second buffer layer 170 having the plurality of concave portions 171 is provided and the black matrix 164 is patterned on each of the plurality of concave portions 171, loss of the matrix 164 pattern may be prevented.

Figure 5:
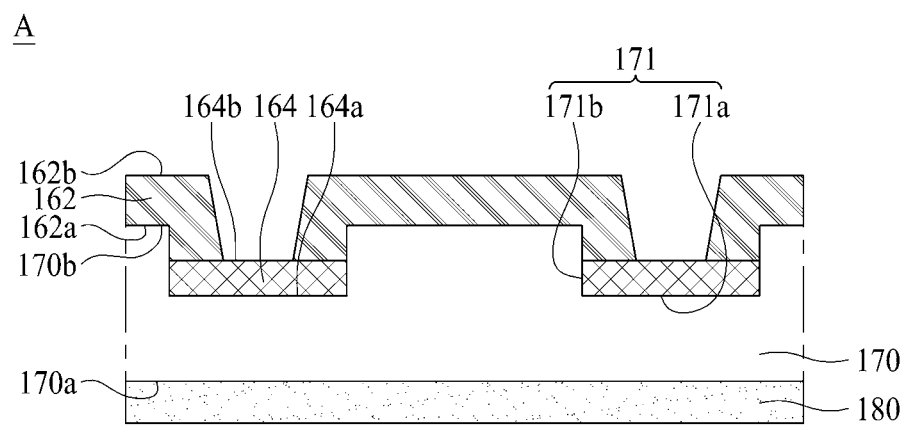
FIG. 5 is a cross-sectional view of the region 'A' of FIG. 2, illustrating another embodiment of a concave portion of a buffer layer and a black matrix.

FIG. 5 is a cross-sectional view illustrating the region 'A' of FIG. 2 and illustrating another embodiment of a concave portion of a buffer layer and a black matrix.

Referring to FIG. 5, the black matrix 164 may be patterned on the second buffer layer 170 and disposed in the concave portion 171 of the second buffer layer 170. According to an example, the black matrix 164 may be inserted into the concave portion 171. Specifically, the black matrix 164 may be surrounded by the concave portion 171, and the upper end 164b of the black matrix 164 may form a step with a surface of the upper end 170b of the second buffer layer. For example, a height of the upper end 164b of the black matrix 164 may be lower than a height of the upper end 170b of the second buffer layer with respect to the substrate 180. The lower end 164a of the black matrix 164 may be in contact with the bottom surface 171a of the concave portion 171, the side surface of the black matrix 164 may be surrounded by the inner surface 171b of the concave portion 171, and the upper end 164b of the black matrix 164 may form a step with the upper end 170b of the second buffer layer. Thus, the lower end 162a of the color filter 162 may surround the upper end 170b of the second buffer layer 170 and an upper portion of the inner side surface 171b of the concave portion 171. The edge of the lower end 162a of the color filter 162 may be disposed in the concave portion 171 and may be in contact with the upper end 164b of the black matrix 164. Thus, surface energy between the color filter 162 and the second buffer layer 170 may be optimized, which may contribute to optimizing surface energy between the black matrix 164 and the second buffer layer 170. As a result, the lower end 164a of the black matrix 164 is in contact with the bottom surface 171a of the concave portion 171 and the upper end 164b of the black matrix 164 is in contact with the lower end 162a of the color filter 162, whereby surface energy between the black matrix 164 and the second buffer layer 170 may be optimized.

Thus, since the black matrix 164 is entirely inserted into the concave portion 171 and the edge of the lower end 162a of the color filter 162 is inserted into the concave portion 171 to cover the upper end 164b of the black matrix 164, surface energy between the black matrix 164 and the second buffer layer 170 may be optimized, and adhesion between the black matrix 164 and the second buffer layer 170 may be enhanced to prevent loss of the black matrix. Here, when the entirety of the black matrix 164 is inserted into the concave portion 171 and the edge of the lower end 162a of the color filter 162 is inserted into the concave portion 171, the entire side surface of the black matrix 164 is in contact with the inner side surface 171b of the concave portion and is stably fixed, and the upper end 164b of the black matrix 164 may be stably fixed by the edge of the lower end 162a of the color filter 162, unlike the case where the height of the upper end 164b of the black matrix 164 and the height of the upper end 170b of the second buffer layer 107 are equal. As a result, surface energy between the lower end 164a of the black matrix 164 and the bottom surface 171a of the concave portion 171 may be optimized, and the display apparatus 100 may prevent the loss of the black matrix 164.

Figure 6:
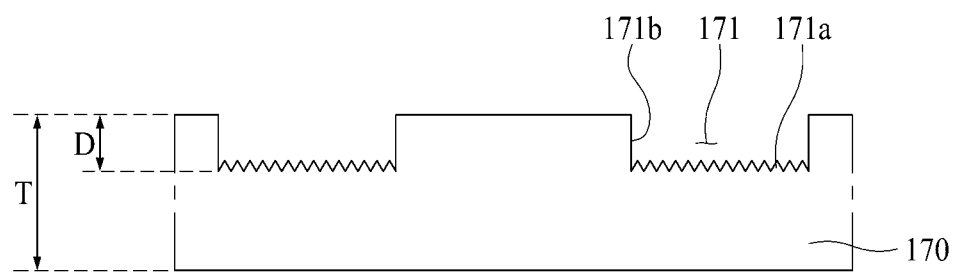
FIG. 6 is a cross-sectional view illustrating a buffer layer in a display apparatus according to an example of the present disclosure.

FIG. 6 is a cross-sectional view illustrating a buffer layer in a display apparatus according to an example of the present disclosure.

Referring to FIG. 6, the bottom surface 171a of the concave portion 171 may have a concavo-convex form. Specifically, the concave portion 171 may be formed by performing an etching process on the second buffer layer 170. The bottom surface 171a of the concave portion 171 may have a concavo-convex form through a surface treatment process. Here, the etching process and the surface treatment process may be performed through a dry etching process, but the present disclosure is not limited thereto. Since the bottom surface 171a of the concave portion 171 is realized in the concavo-convex form, surface energy between the lower end 164a of the black matrix 164 and the bottom surface 171a of the concave portion 171 may be optimized and loss of the black matrix 164 may be prevented, compared with the case where the concave portion 171 does not have the concavo-convex form.

According to an example, the bottom surface 171a of the concave portion 171 may include a functional group so that surface characteristics may be changed. For example, when the bottom surface 171a of the concave portion 171 is formed of silicon dioxide ($SiO_2$) and a surface treatment process is performed on the bottom surface 171a of the concave portion 171 through a plasma gas such as argon (Ar), oxygen ($O_2$), hydrogen ($H_2$), a functional group may be bonded to the existing silicon dioxide ($SiO_2$), or the bond of the existing silicon dioxide ($SiO_2$) may be broken and a new functional group may be formed. Here, a type of the plasma gas and the constituent material of the second buffer layer 170 may be changed to optimize surface energy between the lower end 164a of the black matrix 164 and the bottom surface 171a of the concave portion 171. Specifically, a functional group such as —OH may be formed on the bottom surface 171a of the concave portion 171 through a surface treatment process using a plasma gas, and surface energy for bonding with the black matrix 164 may be optimized. Here, the type of the functional group is not limited to —OH and may be changed depending on the type of the plasma gas and the type of the bottom surface of the concave portion 171. Thus, since the functional group changes the surface characteristics of the bottom surface 171a of the concave portion 171, surface energy between the lower end 164a of the black matrix 164 and the bottom surface 171a of the concave portion 171 may be optimized.

The depth D of the concave portion 171 may be less than ⅓ of the thickness T of the second buffer layer 170 from the upper end 170b of the second buffer layer 170. The height of the lower end 164a of the black matrix 164 may be ⅔ or greater of the height of the upper end 170a of the second buffer layer 170 with respect to the lower end 170a of the second buffer layer 170. Specifically, the second buffer layer 170, including the concave portion 171, may prevent the loss of the black matrix 164 and perform the moisture-proofing function of the display panel. Also, the second buffer layer 170 may maintain a predetermined thickness T in order to prevent moisture transmission to the display panel, but the thickness of the second buffer layer 170 may be reduced by a depth D of the concave portion 171 in the region where the concave portion 171 is formed. Thus, since the depth D of the concave portion 171 is formed to be ⅓ or less of the thickness T of the second buffer layer 170 from the upper end of the second buffer layer 170, the thickness of the second buffer layer 170 in the region where the concave portion 171 is formed may be maintained at a predetermined level or greater. For example, when the second buffer layer 170 has a thickness T of 3000 angstroms (Å), the depth D of the concave portion 171 may have a depth D of 500 to 1000 angstroms (Å). Accordingly, the thickness of the second buffer layer 170 in the region where the concave portion 171 is formed may be ⅔ or greater of the total thickness T of the second buffer layer 170. As a result, by adjusting the depth of the concave portion 171, the second buffer layer 170 may maintain the predetermined thickness capable of preventing loss of the black matrix 164 and performing the moisture-proofing function of the display panel.

FIGS. 7A to 7D are cross-sectional views schematically illustrating a process for a method of manufacturing a buffer layer in a display apparatus according to an example of the present disclosure.

Figure 7A:
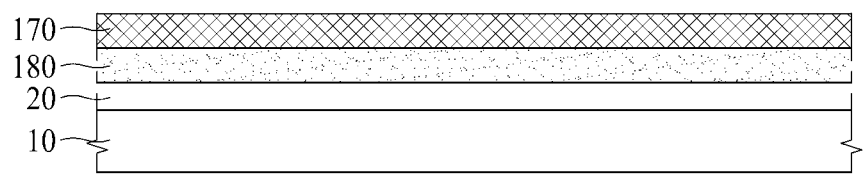
FIGS. 7A to 7D are cross-sectional views schematically illustrating a process of a method of manufacturing a buffer layer in a display apparatus according to an example of the present disclosure.

Referring to FIG. 7A, a carrier glass substrate 10 and a sacrificial layer 20 stacked on an upper end of the carrier glass substrate 10 may be prepared to manufacture the display apparatus 100 according to the present disclosure. The substrate 180 and the second buffer layer 170 may be sequentially stacked on the carrier glass substrate 10. Thus, the carrier glass substrate 10 may support the substrate 180 and the second buffer layer 170 while the substrate 180 and the second buffer layer 170 are stacked. Therefore, the carrier glass substrate 10 may temporarily serve as a support substrate.

Figure 7B:
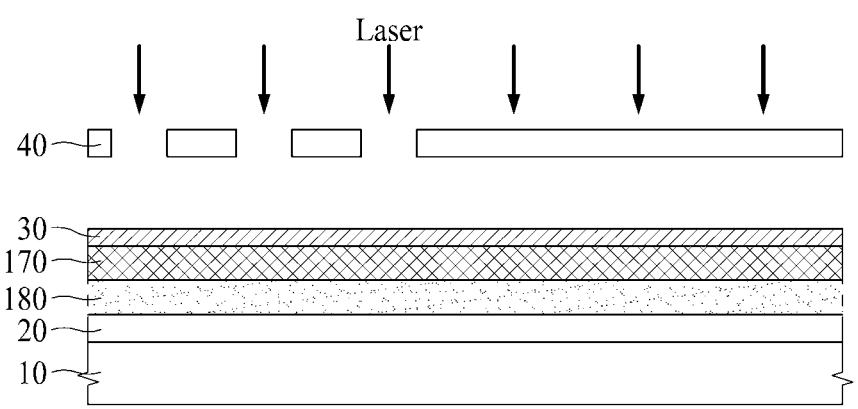

Referring to FIG. 7B, a photoresist 30 may be disposed on the second buffer layer 170 to form a concave portion 171 on the second buffer layer 170. For example, the photoresist 30 may be a positive photoresist (positive PR). A mask 40 may be manufactured according to a shape of the concave portion 171 and may be provided on the photoresist 30 and spaced apart from the photoresist 30 to perform an exposure process. Here, a region where the concave portion 171 is formed refers to the region where the black matrix 164 is patterned, and therefore, the mask used for a patterning process of the black matrix 164 may be used. Therefore, since the process of forming the concave portion 171 on the second buffer layer 170 does not require a separate mask, the manufacturing cost and time of the display apparatus 100 may be reduced. When a laser irradiates a stack, as shown in FIG. 7B, after the mask 40 is disposed, the region of the photoresist 30 corresponding to the concave portion 171 may be removed.

Figure 7C:
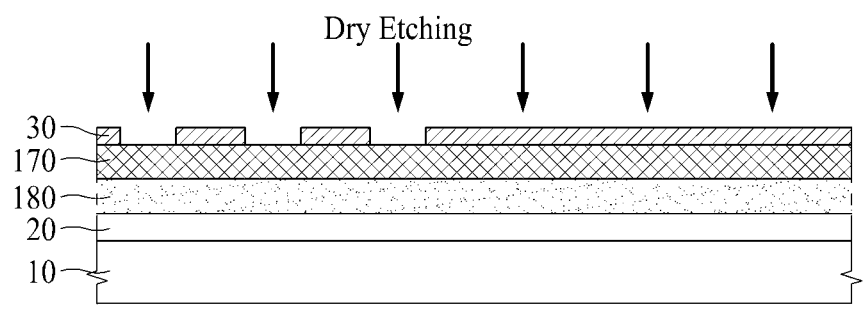
Figure 7D:
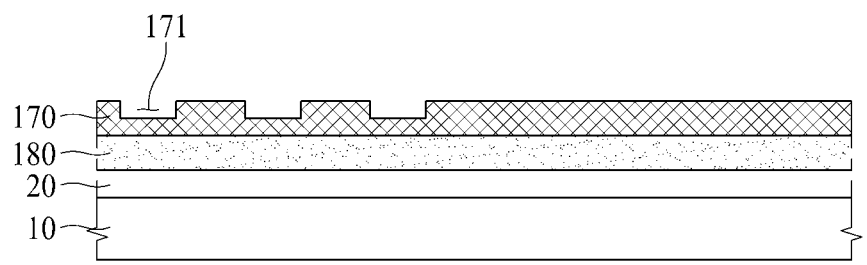

Referring to FIGS. 7C and 7D, when the region of the photoresist 30 corresponding to the concave portion 171 is removed, the concave portion 171 may be formed on the second buffer layer 170 through a dry etching process. According to an example, the concave portion 171 may be formed by performing an etching process on the second buffer layer 170. The bottom surface 171a of the concave portion 171 may have a concavo-convex form through a surface treatment process. Since the bottom surface 171a of the concave portion 171 is realized to have the concavo-convex form, surface energy between the lower end 164a of the black matrix 164 and the bottom surface 171a of the concave portion 171 may be optimized, and loss of the black matrix 164 may be prevented as compared with the case where only the concave portion 171 is formed without the concavo-convex form.

Therefore, since the display apparatus according to the present disclosure includes the buffer layer having the plurality of concave portions, loss of the black matrix pattern may be prevented, and the filling material may be uniformly filled when the transistor substrate and the color filter substrate are bonded. In addition, the display apparatus may prevent leakage of the black matrix pattern, thereby preventing a light leakage and visibility degradation phenomenon, and since a smear phenomenon of the display panel is prevented by uniformly filling the filling material between the transistor substrate and the color filter substrate, the moisture-proofing function of the display panel and reliability of the display apparatus may be improved.

The display apparatus according to the present disclosure includes the buffer layer having the plurality of concave portions, and thus, loss of the black matrix pattern may be prevented, and the filling material may be uniformly filled when the transistor substrate and the color filter substrate are bonded.

In the display apparatus according to the present disclosure, since the buffer layer having the plurality of concave portions and the bottom surface of the concave portions are realized in the concavo-convex form, loss of the black matrix pattern may be prevented to prevent light leakage and visibility degradation, and a smear phenomenon of the display panel may be prevented by uniformly filling the filling material between the transistor substrate and the color filter substrate.

In the display apparatus according to the present disclosure, the thickness of the buffer layer may be increased by alleviating stress applied to the buffer layer and reliability of the display apparatus may be enhanced by improving the moisture-proofing function of the display panel.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
    a plurality of thin film transistors (TFTs) provided on a transistor substrate;
    a plurality of organic light emitting elements provided on the thin film transistors and electrically connected to the plurality of TFTs, respectively;
    a plurality of banks respectively disposed between the plurality of organic light emitting elements and defining opening areas of the plurality of organic light emitting elements;
    an encapsulation layer covering the plurality of thin film transistors and the plurality of organic light emitting elements;
    a buffer layer provided on a substrate and having a plurality of concave portions respectively overlapping the plurality of banks;
    a black matrix disposed at each of the plurality of concave portions;
    a plurality of color filters disposed on the buffer layer between the plurality of concave portions and overlapping the opening areas of the plurality of organic light emitting elements; and
    a filling layer filling a space between the transistor substrate and the substrate,
    wherein an entire surface of a lower portion of the black matrix is surrounded by the plurality of concave portions and an upper portion of the black matrix protrudes from a surface of an upper end of the buffer layer,
    wherein an interface between the black matrix and a bottom surface of each of the plurality of concave portions has a concavo-convex form and an interface between the color filters and the buffer layer is flat.

2. The display apparatus of claim 1, wherein the plurality of concave portions have a step from the surface of the upper end of the buffer layer.

3. The display apparatus of claim 1, wherein a depth of each of the plurality of concave portions is ⅓ or smaller of a thickness of the buffer layer.

4. A display apparatus comprising:
    a plurality of thin film transistors (TFTs) provided on a transistor substrate;
    a plurality or organic light emitting elements provided on the thin film transistors and electrically connected to the plurality of TFTs, respectively;
    a plurality of banks disposed between the plurality of organic light emitting elements and defining an opening area of each of the plurality of organic light emitting elements;
    an encapsulation layer covering the plurality of thin film transistors and the plurality of organic light emitting elements;
    a buffer layer provided on a substrate;
    a black matrix provided on the buffer layer, the black matrix having a lower end disposed to be lower than a height of an upper end of the buffer layer with respect to the substrate, and the black matrix overlapping each of the plurality of banks;
    a color filter having a lower end disposed to have a step on the black matrix and overlapping the opening areas of the plurality of organic light emitting elements; and
    a filling layer filling a space between the transistor substrate and the substrate;
    wherein an entire surface of a lower portion of the black matrix is surrounded by a plurality of concave portions and an upper portion of the black matrix protrudes from a surface of the upper end of the buffer layer,
    wherein an interface between the black matrix and a bottom surface of each of the plurality of concave portions has a concavo-convex form and an interface between the color filters and the buffer layer is flat.

5. The display apparatus of claim 4, wherein a height of an upper end of the black matrix is higher than the height of the upper end of the buffer layer with respect to the substrate.

6. The display apparatus of claim 4, wherein a height of the lower end of the black matrix is ⅔ or greater of the height of the upper end of the buffer layer with respect to a lower end of the buffer layer.

* * * * *